United States Patent
Schroder

(10) Patent No.: US 6,406,997 B1
(45) Date of Patent: Jun. 18, 2002

(54) CHROMIUM FILMS AND CHROMIUM FILM OVERLAYERS

(76) Inventor: Klaus Schroder, 7226 Coventry Rd. N, East Syracuse, NY (US) 13057

(*) Notice: Subject to any disclaimer, the term of this patent is extended or adjusted under 35 U.S.C. 154(b) by 0 days.

(21) Appl. No.: 09/328,480

(22) Filed: Jun. 9, 1999

(51) Int. Cl.$^7$ ............................................... H01L 21/44
(52) U.S. Cl. ...................................... 438/656; 438/582
(58) Field of Search ................................ 438/656, 648, 438/674, 582, 685, 683, 687, 660, 680, 913

(56) References Cited

U.S. PATENT DOCUMENTS

| | | | |
|---|---|---|---|
| 4,260,428 A | * 4/1981 | Roy | .......................... 136/260 |
| 4,905,319 A | 2/1990 | Schroder et al. | |
| 5,244,556 A | * 9/1993 | Inoue | ...................... 204/192.1 |
| 5,580,824 A | * 12/1996 | Tanaka et al. | ............... 437/192 |
| 5,959,359 A | * 9/1999 | Tsuchiya | .................... 257/766 |
| 6,130,161 A | * 10/2000 | Ashley et al. | .............. 438/687 |
| 6,172,296 B1 | * 1/2001 | Iwasaki et al. | ............. 136/256 |

OTHER PUBLICATIONS

J. Lloyd, 1982, The effect of passivation thickness on electromigration lifetime of Al/Cu thin film conductors.
K. Schröder, 1988, Magnetism in Thin Chromium Films.
K. Schröder, 1994, Absolute Seebeck Coefficients of Ultrathin Cr films.
K. Schröder, 1994, Unusual Low Resistivities of Sub–nm Thick Cr overlayers on Ge the Substrates.
K. Schröder, 1993, The Influences of Silicon overlayers on the electrical conductivity of very thin Cr films.
K. Schröder, 1988, The Effect of Pd–overlayers on the Magnetization of Cr films.
K. Schröder, 1996, Hall–effect measurements on Cr films deposited on Ge substrates.
K. Schröder, 1990, Effect of Ge Overlayers on the electrical resistance of thin Cr films.
K. Schröder, 1992, The Effect of Ge Overlayers on the Magnetization of Cr films.
T. Satake, 1972, Electromigration in Al film stripes coated with Anodic Al oxide films.
M. Lucas, 1963, Surface scattering of conduction electrons in gold films.
S. Fouad, 1995, A new approach to the correlation of the electrical properties with interband and intraband transitions of thin Cr films.
R. Vook, 1995, In–situ ultra–high vacuum studies of electromigration in copper films.
A. Learn, 1972, Effect of structure and processing on electromigration–induced failure in Al.
B. Grabe, 1981, Electromigration measuring techniques for grain boundary diffusion activation energy in Aluminum.
R. Vook, 1993, Transmission and reflection electron microscopy of electromigration phenomena.

* cited by examiner

*Primary Examiner*—David Nelms
*Assistant Examiner*—David Nhu

(57) ABSTRACT

A semiconductor device which exhibits reduced electromigration which includes an electrically conductive support member having a thin film of chromium overlaying the conductive support and a layer of semiconductor material overlaying said chromium film. The invention also includes a method of reducing electromigration and resistance and resistance in conductive supporting layers of semiconductor devices by forming a chromium layer over at least one surface of the conductive support layer of the device. The conductive support may be copper or aluminum with a semiconductive layer of germanium or silicon.

16 Claims, 2 Drawing Sheets

CHROMIUM FILMS AND CHROMIUM FILM OVERLAYERS

FIELD OF THE INVENTION

This invention relates generally to chromium films, and more specifically to the use of chromium films to reduce electromigration in semiconductor and related devices.

BACKGROUND OF THE INVENTION

Integrated circuits get smaller and smaller. This makes it possible to place more and more transistors on a given size of an integrated circuit. This requires that connecting lines between transistor and other devices on the silicon chip get smaller and smaller. High current densities are used in such conductors.

Currents in metals are usually carried by electrons. However, if current densities are in the $10^6 \text{ A/cm}^2$ range, and the temperature is high, metal ions are also moving. This phenomena is called electromigration and changes the geometry of the conductors. Hillocs and cracks form and lead to the degradation and failure of electrical conductors. Ions move usually in the same direction as electrons, because the momentum transfer from electrons to ions is responsible for the movement of the ions.

Surface diffusion and surface coatings influence electromigration. Surface coating as protection against failure is a subject of controversy. Opinions range from "no-effect" to "cure-all" according to a review by F. M. D'Heurly and R. Rosenberg (1). These authors suggest that the surface must be considered mainly for the effect of vacancy movement on the surface. Clearly, overlayers produce specific vacancy concentrations at the interface.

Schwarz (2) in his review of electromigration in interconnects and contacts gives a summary of results of such studies. Aluminum strips covered with silicon dioxide showed an increase by a factor of 3 in the Mean Time to Failure (MTF) (3), or by a factor of 23 by first anodizing films and then adding a porous layer (4). Sputter conditions of the silicon dioxide influenced the MTF (5). Al-Cu conductors (6) with 1.5 $\mu$m of glass had a longer lifetime than those without glass. The glass overlayer produced changes in the failure mechanism.

A brief review included in a recent report on electron microscopy studies of electromigration defects (7) shows that there is now an increasing interest in electromigration on very clean surfaces. Most of these studies involve semiconductor surfaces or adatoms on semiconductor surfaces. A few studies were concerned with clean copper surfaces (8, 9), and only one paper was listed in which systems with Ni-adatoms on polycrystalline W- and Mo-surfaces were studied.

As stated above, one of the major results of the study of electromigration is, that the movement of atoms is strongly influenced by the momentum transfer from electrons to ions. Only non-elastic collision can produce such a momentum transfers. Systems, in which collisions between electrons and ions are mostly elastic, should show low electromigration. This would be found in systems, in which the surface resistance is very low.

It seems that this concept of low surface resistance as failure inhibitor has not been considered. This may be due to the fact, that the scattering process of electrons at the surface is difficult to modify, so it did not seem to be an adjustable parameter.

The surface resistance in metals can be studied in resistance measurements of thin films. Films less than 2 nm thick are usually discontinuous, 2 to 6 nm thick films are semi-continuous (10). The resistivity of thin continuous films is in first approximation inversely proportional to the thickness t. For instance, Fuad et al. (11) found for chromium prepared at base pressures in the $10^{-6}$ Torr range:

$$p = 2 \cdot 10^{-8}/t (\Omega m^2)$$

with t the thickness of the film measured in meter. If $t \geq 80$ nm, the resistivity is usually constant. It is larger than the bulk resistivity, because the thin film has a high defect density.

Surface scattering can be modified, if one adds overlayers on a thin film. This leads usually to a resistance increase. For instance, if one adds to an annealed Au-film a fractional monolayer of gold atoms (12), the resistance R of this film increases, in spite of the fact that the average film thickness increases. The resistance increase can be explained with an increase in non-elastic electron scattering. The annealed Au-film has in most sections rather flat surfaces. Add-atoms, even if they are from the same material, destroy this smoothness, and produce an increase in the resistivity. If one adds an overlayer of different atoms to a film, the resistance of the film will usually increase, even if the overlayer atoms are metallic. This resistance increase would not be expected in simple theories, where

TABLE 1

| Substrate | Thickness of Substrate | Overlayer | $\Delta R/$ due to a 0.7 nm thick overlayer |
|---|---|---|---|
| Silver | 15 nm | Ge | +20% |
| Gold | 22.3 nm | Permalloy | +12% |
| Aluminum | 10 nm | Germanium | 0% |
| Copper | 12.9 nm | $SiO_2$ | 0% |
| Copper | 12.9 nm | Chromium | −4% | one would assume that one has two parallel conductors, each with its given conductance, and the total conductance should be the sum of the conductances of both films. Naturally, the conductance of the overlayer should be very small, since it is very thin, but it should give a positive contribution.

The resistance increase due to overlayers is due to increased non-elastic scattering in the bilayer structure. The scattering of electrons in a sample with a thin overlayer takes place not only on the ("new") surface, but also on the interface between the original film and the overlayer (the "old" surface).

One exception to the rule that thin overlayers increase the resistance is the case Were Cr-atoms are deposition on Cu-films. Table 1 show that a Cr-overlayer 0.7 nm thick reduces the resistance of the film by 4%. This is about the value expected from the film thickness change.

We measured the influence of a chromium overlayer of 0.3 nm on a 4.3 nm thick copper film and found a strong resistance decrease. The relative resistance change was −46%. The resistance decreased in a 6 $\mu$m thick Cu-films by 60% if a 1 $\mu$m thick Cr-overlayer was added. These changes are much stronger than the 4% decrease found by Chopra and Randlett (13). Chopra and Randlett's result can be explained with the thickness increase in their sample. Our resistance decrease is much stronger and represent a new discovery.

That chromium overlayers can influence electromigration was found in the case of silver conductors by Rosenberg et al. (14). These authors studied grain boundary contributions to transport. They studied damage mechanisms, effects of diffusivity, vacancies and grain boundaries on electromigration. They described one test, in which they covered the top of an Ag-film with a 10 nm thick diffusion resistant chromium overlayer to avoid grooving on the silver film. The side of the Ag-film was bare. After subjecting the film to a high current, the top surface covered with chromium showed no defects due to electromigration, whereas the bare edge of the silver film showed a growth pattern. However, it is possible that the edge of an uncoated film shows more defect growth than an (uncoated) top surface because the sharp curvature of the edge surface changes the surface energy (higher vapor pressure, different vacancy concentration than other sections of the film). The typical studies for failure, namely the deteriation of the silver film with time as indicated by resistance changes was not studied, nor was the time to failure measured. No suggestion was made that chromium was superior to other (metallic) overlayers to reduce electromigration defects.

We studied magnetic properties, the Hall effect, the Seebeck effect, and the electrical resistivities of Cr-films on different substrates and with different overlayers over many years (15–23). Some magnetic properties were unusual (15–18). The magnetic diamagnetism was much larger than found in any other materials, except superconductors (15–18). This indicates that the films are most likely partly superconducting. The Seebeck coefficient (19) and the Hall coefficient (20) were close to zero for very thin Cr-films on Ge-substrates, characteristic for superconducting materials.

We measured the electrical resistance of ultra thin Cr-films (21–22). The resistance per square in Ohms, R (square), at room temperature is given between 0.11 nm and 10 nm by:

$$R(\text{square}) = 2000/t^{1-3}$$

if t is given in nm. These films have at room temperature resistance per square values which are by an order of magnitude smaller than the resistance per square values of silver films with the same thickness, tested at 20 K. The low resistance per square value of the Cr-film shows, that inelastic scattering on Cr-surfaces is very low. The resistance decreased further if Ge- or Si-overlayers were deposited on top of the Cr-film (21–23).

The resistance decreases in our Cu-film with overlayers of chromium show, that Cr-overlayers decrease inelastic electron surface scattering. Also, interfacial scattering at the "Cr-overlayer"—"Cu-substrate" are low. Ge- or Si-layers deposited on top of the Cr-overlayers lead to a further reduction in surface resistance. This again leads to an increase in the reliability of these conductors, and will also help to protect the films against corrosion.

SUMMARY OF THE INVENTION

It is the objective of this invention to increase the lifetime of interconnects in integrated circuits by adding overlayers which decrease the electrical surface resistance. This objective is accomplished by coating these conductors such as gold, copper or aluminum with an overlayer of chromium. Additionally, a layer of germanium or silicon may be used to cover the chromium overlayer. Aside from reducing the electrical surface resistance, these chromium films will reduce surface diffusion since the diffusion coefficient of chromium is much lower than the diffusion coefficient of copper at the same testing temperature.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which.

DETAILED DESCRIPTION OF THE INVENTION

Conductors in large scale integrated devices have to carry very high current densities. This leads to electromigration. That is induced by energy and momentum transfer from electrons to ions. This requires that the electron is scattered in an inelastic process by the metallic ions. Very thin chromium films can be produced in such a way that they have very low surface resistance values. This demonstrates that inelastic surface scattering is very low in this material. Chromium overlayers on copper show also low surface resistance values. This proves that a chromium film on copper has also low inelastic surface scattering. Therefore, if chromium overlayers are prepared in such a way that they have low resistance values, then they will produce systems with low electromigration and long service life.

Such films have been prepared by evaporation of materials and their subsequent adsorption on substrates, but they can also be prepared in a molecular beam apparatus, in which first the conducting, then the chromium and finally the germanium (or silicon) films are deposited in a ultra high vacuum system. Under these conditions, the chromium films show the low surface resistance values required to produce the low electromigration. Chemical vapor deposition techniques may also be employed if they produce low resistance films.

Figure 1:
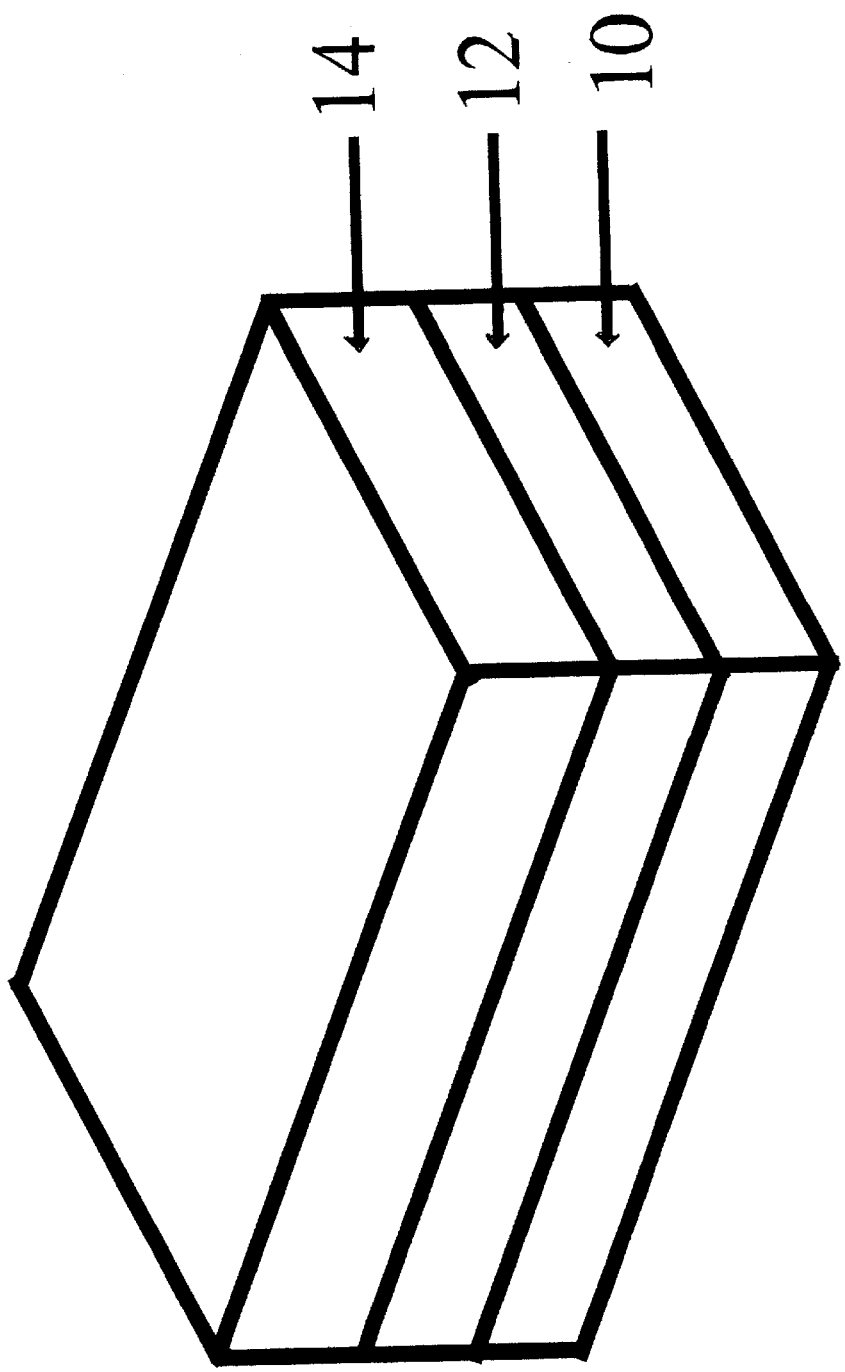
FIG. 1 is a perspective view of a device illustrating one embodiment of the invention.

FIG. 1 illustrates one embodiment of the present invention which consists of a conductive substrate (10), a chromium conductor (12), and a semiconducting overlayer (14).

Figure 2:
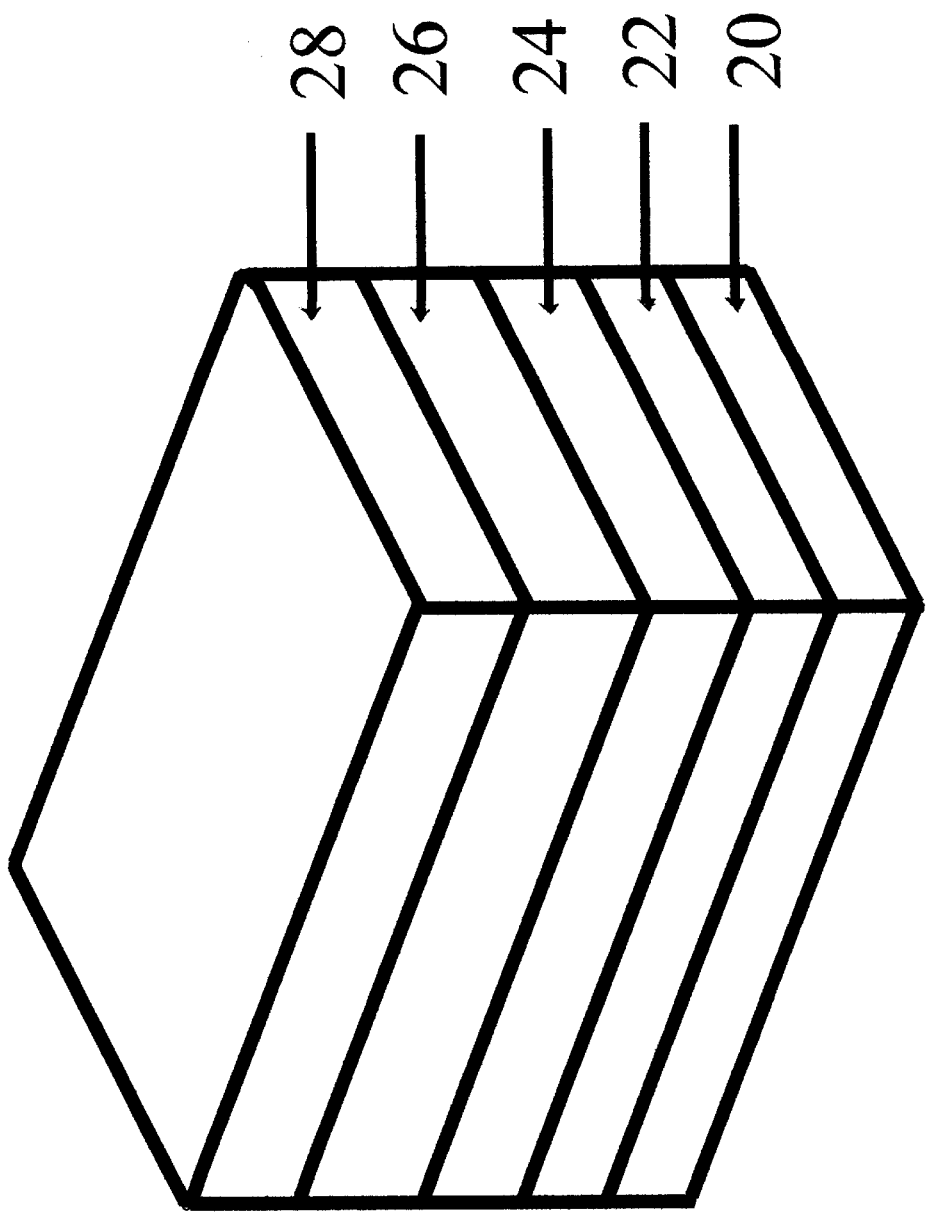
FIG. 2 is a perspective view of a device illustrating a second embodiment of the invention.

FIG. 2 illustrates a second embodiment of a proposed device of the present invention. On a substrate of silicon, doped silicon or oxidized silicon (20), an interfacial layer (22) is deposited. This layer may be metallic, a compound, or an intermediate phase. It is inserted to improve adhesion between (20) and (24), or to prevent undesired diffusion. It should also be selected to give a low electrical interface resistance. This can be achieved by using low resistance chromium as interfacial layer. On top of this interfacial layer, the metallic conductor (24) is deposited. This conductor could be copper. A chromium film (26) is deposited on top of the metallic conductor, which in turn may be coated with a semiconductor like germanium or silicon (28).

Using a chromium or chromium alloy film as interfacial layer (22, FIG. 2) between the substrate (20, FIG. 2) and the conductor (24, FIG. 2) will also improve the performance of the device, because this system can be prepared in such a way in a high vacuum system, that the interfacial resistance is very low. This reduces heating in the conductor, which in turn reduces electromigration on the interface between the conducting film (24, FIG. 2) and the chromium film on top of it (26, FIG. 2).

REFERENCES

1. F. M. D'Heurly and D. Rodenber, Physics of Thin Films, Vol. 7, 1973, pp 257
2. J. Schwarz, In VLSI Electronics Microstructure Science, Vol. 15, Edt. N. G. Einspruch, S. C. Cohen, and G. S. Gildenblat, Academic Press New York, 1987, pp 345

3. T. Sakate, K. Yokoyama, S. Shirakawa, and Sawaguchi, Jpn. J. Appl. Phys. 4,1973, pp 12
4. A. J. Learn, J. Appl. Phys. 3, 1973, pp 44
5. H. U. Schreiber and B. Grabe, Solid State Electronics, 24, 1981, pp 1135
6. J. R. Lloyd and P. M. Smith, J. Vac. Scie. Technol, 1, 1983, pp 2
7. R. M. Vook, Materials Chemistry and Physics 36 (1995) pp 199
8. H. B. Jo and R. Vook, Appl. Surf. Scie. 89, 1995, pp 237
9. H. B. Jo and R. Vook, Thin Solid Films 262 (1995) pp 128
10. I. M. Rycroft and B. L. Evans, Thin Solid Films 290- 1, 1996, pp 283
11. S. S. Fuad, A. H. Ammar and M. H. El-Fazary, phys. Stat. Sol. 9bO 187, 1995, pp 99
12. M. S. P. Lukas, Appl. Phys. Letters 4, 1964, pp 73
13. K. L. Chopra, and R. Randlett, J. Appl. Phys. 38, 1967, pp 3144
14. R. Rosenberg, A. F. Mayadas, and D. Gupta, Surface Science 31, pp 566, 1972
15. K. Schröder and H. Hejase, Physica Status Solidi (b) 149, 1988, pp 658
16. H. Hejase, A. Miller, and K. Schröder, J. Phys. C. 8-49, 1988, pp1647
17. K. Schröder and H. Hejase, U.S. Pat. No. 4,905,319 Fber. 17, 1990
18. K. Schröder and S. Nayak Phys. Stat. sold. (b) 172, 1992, pp 679
19. K. Schröder, Le Zhang, W.- T Ger, phys. stat. sol. 181, 1994, pp 421;
20. C.-S. Hsieh and K. Schröder, J. appl. Phys. 79, 1996, pp. 6522
21. K. Schröder and L. Walsh, J. Vac. Sci. Techn. A 9, 1991, pp 577;
22. Le Zhang and K. Schröder, Phys. Stat. Sol. (b) 183, k %, 1994
23. A. N. Aleshin and K. Schröder, MRS Conference, Boston, 1993, K. Schröder and S. Nayak, phys. stat. sol. (b) 172 1992, pp 679

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed:

1. A method of reducing electromigration in a metallic electrical conductor selected from the group consisting of chromium and chromium alloys, comprising the step reducing an electrical resistance at the surface; measuring a chromium overlayer of 0.3 nm on a 4.3 nm thick Cu-film; and preparing said metallic conductor in a high vacuum system with a pressure of less than $10^{-5}$ Torr.

2. A method of reducing electromigration in said metallic electrical conductor as in claim 1 by adding a semiconducting overlayer.

3. A method of reducing electromigration in said metallic electrical conductor as in claim 2 by depositing said semiconducting overlayer in a high vacuum system with a pressure of less than $10^{-5}$ Torr.

4. A method of reducing electromigration in said metallic electrical conductor and said semiconducting overlayer as in claim 2 by a heat treatment.

5. A method of reducing electromigration in an electrical conductor selected from a group consisting of copper, copper alloys, aluminum, aluminum alloys, gold, gold alloys, and silver alloys by adding an overlayer selected from the group consisting of chromium and chromium alloys; and preparing this conductor and semiconductor in a high vacuum system with a pressure of less than $10^{-5}$ Torr.

6. A method as in claim 5 in which said electrical conductor and said overlayer are subject to heat treatments.

7. A method of reducing electromigration in a metallic conductor by adding a first overlayer selected from the group consisting of chromium and chromium alloys with low electrical resistance and then adding a semiconducting overlayer on top of said first overlayer, and in which the low resistance is obtained by depositing said first overlayer and said semiconducting overlayer in a high vacuum system with a pressure of less than $10^{-5}$ Torr.

8. A method for reducing electromigration as in claim 7 in which said metallic conductor, said first overlayer and said semiconducting overlayer undergoes heat treatments to reduce the electrical resistance.

9. A method of reducing electromigration in an electrical conductor selected from the group consisting of all metallic elements and alloys except silver by adding an overlayer selected from the group of chromium and chromium alloys, and in which said electrical conductor and said overlayers are prepared in a high vacuum system with a pressure of less than $10^{-5}$ Torr.

10. A method as in claim 9 in which said electrical conductor and said overlayer are subject to heat treatments.

11. A method of reducing electromigration in an electrical conductor selected from the group consisting of all metallic elements and alloys by using as interfacial layer between the conductor and the substrate a chromium film prepared without sputtering in a high vacuum system with a pressure of less than $10^{-5}$ Torr in such a way that the electrical resistance near the interface between the conductor and said intermediate material is low.

12. A method as in claim 11 in which said electrical conductor and said interfacial layer are subject to heat treatments.

13. A method of reducing electromigration in an electrical conductor by depositing on the substrate a first layer which prevents diffusion, a second layer which consists of chromium or chromium alloys prepared in a vacuum system with a pressure of less than $10^{-5}$ Torr, on which a third layer consisting of a metallic conductor is deposited, and on top of it a fourth layer consisting of chromium is also deposited under high vacuum conditions at a pressure below $10^{-5}$ Torr in such ways that the electrical resistances near the interfaces between the electrical conductor in the third layer and the chromium films in the second or fourth layers respectively are low.

14. A method as in claim 13 in which said electrical conductor and said interfacial layer and said overlayers are prepared in a high vacuum system.

15. A method as in claim 13 in which said electrical conductor and said interfacial layer are subject to heat treatments.

16. A method as in claim 14 in which said electrical conductor and said interfacial layer are subject to heat treatments.

* * * * *